(12) United States Patent
Kasai

(10) Patent No.: US 10,658,418 B2
(45) Date of Patent: ***May 19, 2020

(54) SEMICONDUCTOR DEVICE AND METHOD OF MANUFACTURING THEREOF

(71) Applicant: LAPIS Semiconductor Co., Ltd., Yokohama (JP)

(72) Inventor: Hiroki Kasai, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 5 days.

This patent is subject to a terminal disclaimer.

(21) Appl. No.: 15/966,601

(22) Filed: Apr. 30, 2018

(65) Prior Publication Data

US 2018/0247970 A1    Aug. 30, 2018

Related U.S. Application Data

(63) Continuation of application No. 15/661,639, filed on Jul. 27, 2017, now Pat. No. 9,991,310, which is a continuation of application No. 15/270,101, filed on Sep. 20, 2016, now Pat. No. 9,754,991.

(30) Foreign Application Priority Data

Sep. 24, 2015   (JP) ................................. 2015-186403

(51) Int. Cl.
*H01L 27/12* (2006.01)
*H01L 27/146* (2006.01)
*H01L 27/30* (2006.01)

(52) U.S. Cl.
CPC .. *H01L 27/14659* (2013.01); *H01L 27/14636* (2013.01); *H01L 27/14658* (2013.01); *H01L 27/14665* (2013.01); *H01L 27/14676* (2013.01); *H01L 27/14689* (2013.01); *H01L 27/308* (2013.01); *H01L 27/1463* (2013.01); *H01L 27/14612* (2013.01)

(58) Field of Classification Search
CPC ......... H01L 27/14658; H01L 27/14665; H01L 27/14676; H01L 27/308
USPC ........................................................ 257/347
See application file for complete search history.

(56) References Cited

U.S. PATENT DOCUMENTS 9,356,163 B1    5/2016  Liu et al.
9,991,310 B2 *  6/2018  Kasai ................ H01L 27/14636
2005/0269642 A1  12/2005  Minami

FOREIGN PATENT DOCUMENTS

JP          2013-069924 A       4/2013

* cited by examiner

*Primary Examiner* — David Vu
*Assistant Examiner* — Brandon C Fox
(74) *Attorney, Agent, or Firm* — Rabin & Berdo, P.C.

(57) ABSTRACT

A semiconductor device includes a first semiconductor layer of a first conductivity type having a first surface on one side thereof and a second surface on an opposite side thereof, and having an element therein, a second semiconductor layer of a second conductivity type having a circuit element formed therein, the second semiconductor layer being formed at the one side of the first surface of the first semiconductor layer, an insulating layer disposed on the first surface of the first semiconductor layer, and a charge-attracting layer configured to attract electrical charges generated in the insulating layer when a predetermined voltage is supplied to the charge-attracting layer.

8 Claims, 11 Drawing Sheets

SEMICONDUCTOR DEVICE AND METHOD OF MANUFACTURING THEREOF

CROSS REFERENCE TO RELATED APPLICATION AND INCORPORATION BY REFERENCE

This is a continuation of U.S. application Ser. No. 15/661,639, filed on Jul. 27, 2017, which is a continuation of U.S. application Ser. No. 15/270,101, filed on Sep. 20, 2016 (now U.S. Pat. No. 9,754,991, issued on Sep. 5, 2017). Furthermore, this application claims the benefit of priority of Japanese application number 2015-186403, filed on Sep. 24, 2015. The disclosures of these prior applications are incorporated herein by reference.

BACKGROUND OF THE INVENTION

Technical Field

The present invention relates to a semiconductor device and a manufacturing method of a semiconductor device.

Background Art

Semiconductor devices in which a semiconductor layer having a sensor formed therein and a semiconductor layer having a peripheral circuit formed therein are stacked on the same semiconductor substrate through an insulating film are known. One example of such semiconductor devices is an X-ray sensor in which circuit elements such as a transistor and resistance and a PN diode that functions as a sensor are formed together on the same SOI (silicon on insulator) substrate.

In the X-ray sensor formed on the SOI substrate, a MOS-FET (metal oxide semiconductor-field effect transistor: will be simply referred to as a transistor below) for the circuit operation and the like are formed in a silicon layer of the SOI substrate, and a pixel sensor is formed adjacent to the substrate. Between the silicon layer and the substrate, a buried oxide (BOX) film is interposed. When X-ray is radiated, the X-ray collides with atoms in the silicon and the oxide film, which form the X-ray sensor, and generates electron-hole pairs. Among them, electrons or holes generated near the substrate are attracted to an electrode due to the field effect, extracted to the outside, and converted to an electric signal. This way, the function of the X-ray sensor is realized. However, when electron-hole pairs are generated in an oxide film such as the buried oxide film, positive charges are trapped and accumulated in the oxide film in some cases.

As the total amount of X-ray radiated to the X-ray sensor increases, the total amount of positive charges accumulated in the oxide film also increases. In some cases, the accumulated positive charges cause a characteristic change of the transistor, and the degree of the characteristic change may fluctuate depending on the amount of accumulated positive charges. In particular, positive charges trapped in the field oxide film that faces the channel region of the transistor, or positive charges trapped in the buried oxide film might change the threshold voltage or the current amount of the transistor or generate a leak current that is not relevant to the control by the gate.

One known example of the prior art that achieves an X-ray sensor configured to suppress a leak current is a semiconductor device disclosed in Japanese Patent Application Laid-open Publication No. 2013-069924 (will be referred to as Patent Document 1 below). As shown in FIG. 1 of Patent Document 1, a semiconductor device (100) includes a photodiode (30), a semiconductor region (14), a buried oxide film (10), and a semiconductor layer (9).

The photodiode (30) has a semiconductor layer (11) of one conductivity type, a first semiconductor region (182) of the other conductivity type that is disposed in a primary surface (151) of the semiconductor layer, semiconductor regions (191) and (192) of the one conductivity type that have a higher impurity concentration than that of the semiconductor layer (11), and a semiconductor region (99). The semiconductor regions (191) and (192) are formed in the primary surface (151) of the semiconductor layer (11) so as to be separated from the semiconductor region (182). The semiconductor region (99) of the one conductivity type has a higher impurity concentration than that of the semiconductor layer (11) and a lower impurity concentration than that of the semiconductor regions (191) and (192). The semiconductor region (99) is formed in the primary surface (151) of the semiconductor layer (11) at least between the semiconductor region (182) and the semiconductor regions (191) and (192).

The semiconductor region (14) of the other conductivity type is formed in the primary surface (151) of the semiconductor layer (11) and is given a fixed potential. The buried oxide film (10) is disposed on the primary surface (151) of the semiconductor layer (11). The semiconductor layer (9) is formed on the buried oxide film (10) and has a transistor element (40) formed therein.

In the semiconductor device (100) disclosed in FIG. 1 of Patent Document 1, the semiconductor region (99) functions as an inversion preventing layer of the primary surface (151) of the semiconductor layer (11), which suppresses the generation of a leak current at the interface of the semiconductor layer (11) and the buried oxide film 10. In the transistor element 40 formed in the semiconductor layer (9), the channel region thereof on the side closer to the buried oxide film (10) is not activated due to the effect of the semiconductor region (14), and therefore, it is possible to suppress the generation of a leak current that is not relevant to the control by the gate electrode (15).

SUMMARY OF THE INVENTION

In the X-ray sensor described above, in view of the above-mentioned phenomenon of the positive charges being trapped in the oxide film, there is a demand to suppress the characteristic change of the active element such as a transistor caused by the entrapment of charges in the oxide film (generally, insulating region) so that the accurate operation is ensured. However, an X-ray sensor that takes into consideration the phenomenon described above and that is configured to suppress the characteristic change of the active element caused by such a phenomenon has not been fully studied. The semiconductor device disclosed in FIG. 1 of Patent Document 1 is aiming at suppressing the generation of an unintended current, but the main focus thereof is to suppress a leak current that flows through the surface of the semiconductor layer (11) due to the interface state generated at the interface between the semiconductor layer (11) and the buried oxide film (10). Thus, the semiconductor device disclosed in Patent Document 1 is not designed to suppress the characteristic change of the transistor caused by the entrapment of electric charges in the buried oxide film (10) due to the X-ray radiation.

The invention was made in view of the above-mentioned points, and an object thereof is to provide a semiconductor device that can suppress the characteristic change of an active element caused by the entrapment of charges in an insulating region, and a manufacturing method of the semiconductor device.

According to one aspect of the present invention, a semiconductor device includes a first semiconductor layer of a first conductivity type having a first surface on one side thereof and a secondary surface on an opposite side thereof, and having an element therein, a second semiconductor layer of a second conductivity type having a circuit element formed therein, the second semiconductor layer being formed at the one side of the first surface of the first semiconductor layer, an insulating layer disposed on the first surface of the first semiconductor layer, and a charge-attracting layer configured to attract electrical charges generated in the insulating layer when a predetermined voltage is supplied to the charge-attracting layer.

According to another aspect of the invention, a semiconductor device includes a first semiconductor layer of a first conductivity type having a primary surface and a secondary surface and having a sensor therein, a second semiconductor layer of a second conductivity type having a circuit element formed therein, the second semiconductor layer being formed at a same side of the primary surface of the first semiconductor layer, and an insulating layer formed between the first semiconductor layer and the second semiconductor layer, the insulating layer being disposed on the primary surface of the first semiconductor layer so as to surround the circuit element, the insulating layer including a charge-attracting semiconductor pattern of the first conductivity type that is disposed near the circuit element, the charge-attracting semiconductor pattern being configured to attract electrical charges generated in the insulating layer.

According to one aspect of the invention, a manufacturing method of a semiconductor device includes preparing a semiconductor substrate that includes a first semiconductor layer of a first conductivity type, a first insulating layer formed on the first semiconductor layer, and a second semiconductor layer of a second conductivity type formed on the first insulating layer, forming, in a portion of the second semiconductor layer, an active region of the second conductivity type so as to be surrounded by a second insulating layer, the second insulating layer being integrally formed with the first insulating layer, and forming a charge-attracting semiconductor pattern in the first insulating layer so as to be adjacent to the active region, the charge-attracting semiconductor pattern being configured to attract electric charges generated in the first insulating layer or the second insulating layer.

According to another aspect of the invention, a manufacturing method of a semiconductor device includes preparing a semiconductor substrate that includes a first semiconductor layer of a first conductivity type, a first insulating layer formed on the first semiconductor layer, an intermediate semiconductor layer of the first conductivity type formed on the first insulating layer, a second insulating layer formed on the intermediate semiconductor layer, and a second semiconductor layer formed on the second insulating layer, forming, in a portion of the second semiconductor layer, an active region of the second conductivity type so as to be surrounded by a third insulating layer, the third insulating layer being integrally formed with the second insulating layer, and forming a charge-attracting semiconductor pattern in the second insulating layer so as to be adjacent to the active region, the charge-attracting semiconductor pattern being configured to attract electric charges generated in the second insulating layer or the third insulating layer.

According to the present invention, it is possible to provide a semiconductor device that can suppress the characteristic change of an active element caused by the entrapment of charges in an insulating region, and a manufacturing method of the semiconductor device.

DETAILED DESCRIPTION OF THE INVENTION

Figure 1:
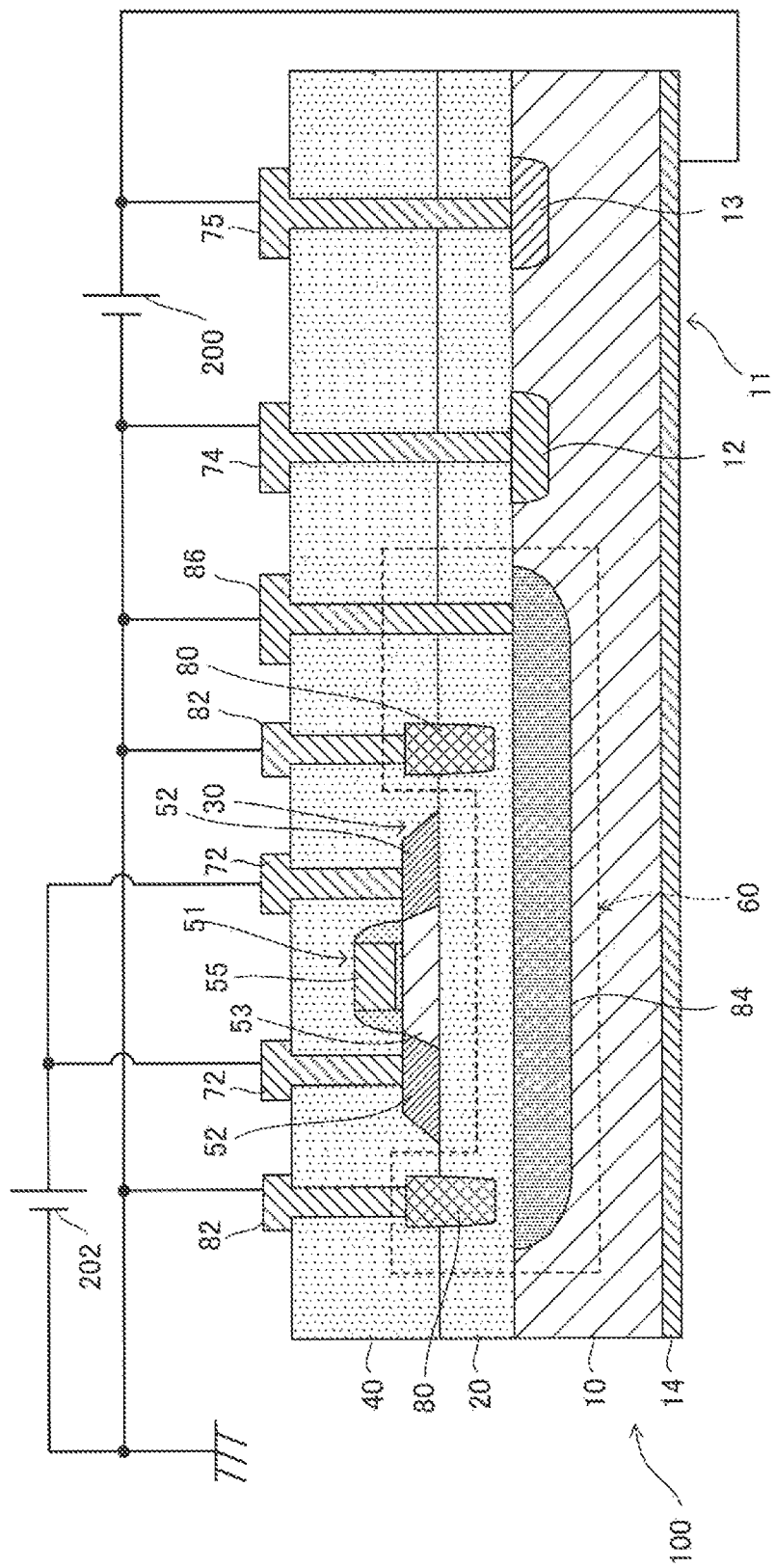
FIG. 1 is a vertical cross-sectional view showing an example of the configuration of a semiconductor device of Embodiment 1.

Embodiments of the present invention will be explained below with reference to figures. In the respective figures, constituting elements or parts that are identical or equivalent to each other are given the same reference characters, and overlapping descriptions will be omitted as necessary.

Embodiment 1

FIG. 1 is a vertical cross-sectional view showing an example of the configuration of a semiconductor device 100 of this embodiment. The semiconductor device 100 includes a photodiode 11 constituting an X-ray sensor and a transistor 51 that is a circuit element constituting a peripheral circuit. The photodiode 11 and the transistor 51 are formed in an SOI (silicon on insulator) substrate that is formed by stacking a first semiconductor layer 10 made of an n-type semiconductor, a first insulating layer 20, and a second semiconductor layer 30 made of a p-type semiconductor in this order.

The photodiode 11 includes an anode 12 made of a high concentration p-type semiconductor and a cathode 13 made of a high concentration n-type semiconductor that are disposed on the surface of the first semiconductor layer 10, which is made of low-concentration n-type silicon, so as to be separated from each other. The photodiode 11 also includes an anode electrode 74 connected to the anode 12, a cathode electrode 75 connected to the cathode 13, and a rear electrode 14 formed on the rear side of the first semiconductor layer 10.

The circuit element including the transistor 51 is formed on the second semiconductor layer 30 at a position that does not overlap the photodiode 11. The transistor 51 includes a channel region 53, a gate electrode 55 formed on the channel region 53, source and drain regions 52 made of a high concentration n-type semiconductor and disposed to have the channel region 53 therebetween, and source and drain electrodes 72 connected to the source and drain regions 52 respectively. The surface of the second semiconductor layer 30 is covered by a second insulating layer 40 made of an insulator such as a silicon oxide film ($SiO_2$ film).

The semiconductor device 100 also includes a charge-attracting part 60 as a charge-attracting semiconductor pattern. The charge-attracting part 60 of this embodiment includes a buried polysilicon (polycrystalline silicon) 80 as a charge-attracting semiconductor layer, and a buried well 84 as a fixed potential region (predetermined potential region), and a buried polysilicon electrode 82 is connected to the buried polysilicon 80, and a buried well electrode 86 is connected to the buried well 84. The buried polysilicon 80 is made of n-type polysilicon (polycrystalline silicon) as described below. The buried well 84 is a semiconductor region formed by injecting a p-type impurity into the first semiconductor layer 10 as described below. In some cases, the buried well 84 has a contact region (not shown in the figure), to which a high-concentration p-type impurity has been injected, in a region that includes the interface with the buried well electrode 86.

Figure 2:
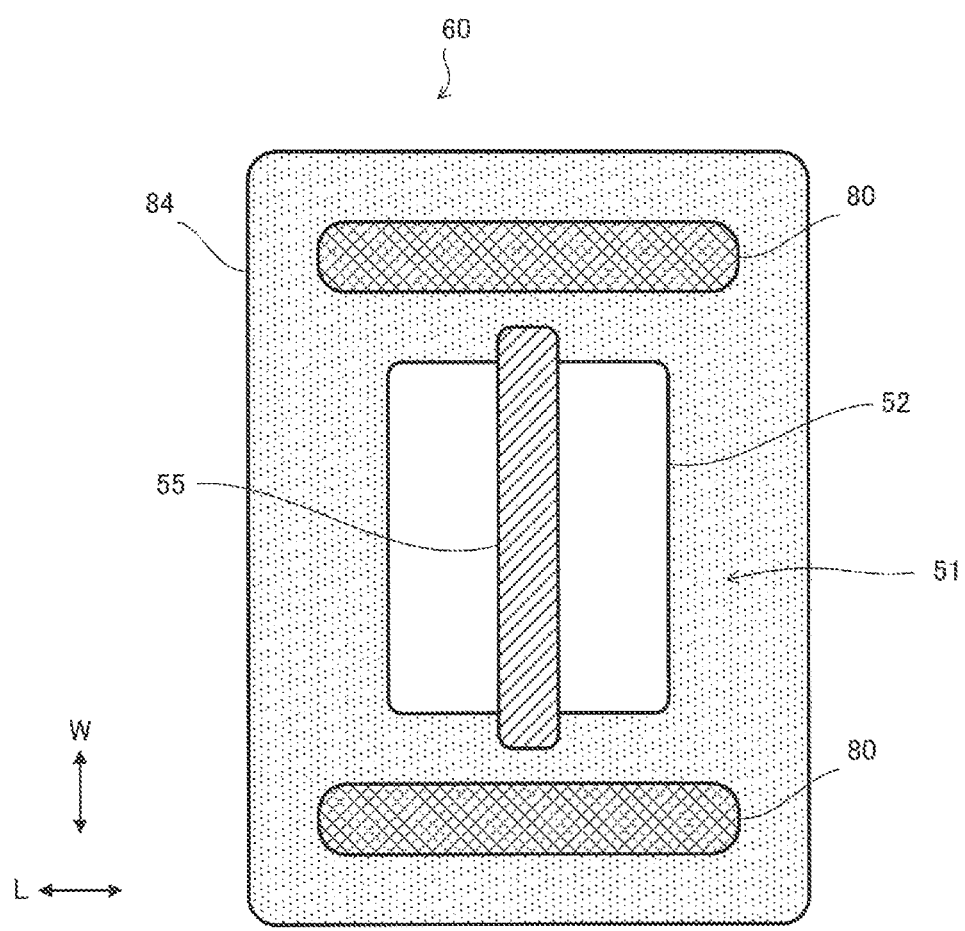
FIG. 2 is a plan view showing an example of the configuration of a charge-attracting part of Embodiment 1.

FIG. 2 is a plan view of the charge-attracting part 60. As shown in FIG. 2, the buried polysilicon 80 has two regions that are separated from the transistor 51 in the gate width direction of the transistor 51 (direction indicated with the arrow W in FIG. 2) and that extend in the gate length direction (direction indicated with the arrow L in FIG. 2). The buried well 84 is formed so as to include the transistor 51 and the buried polysilicon 80 in a plan view.

Next, one example of the bias method in using the semiconductor device 100 will be explained with reference to FIG. 1 again. In order to detect X-ray in the semiconductor device 100, a reverse bias voltage is applied to the photodiode 11, thereby depleting the first semiconductor layer 10. That is, in order to detect X-ray in the semiconductor device 100, the rear electrode 14 and the cathode electrode 75 are connected to the positive electrode of a power source 200, and the anode electrode 74 is connected to the negative electrode of the power source 200, which is connected to the ground potential. The reverse bias voltage applied to the photodiode 11, or in other words, the voltage of the power source 200, is several hundred volts, for example. On the other hand, the source and drain electrodes 72 connected to the source and drain regions 52 of the transistor 51 are connected to the positive electrode of a power source 202. The voltage applied to the source and drain regions, or in other words, the voltage of the power source 202 is several volts, which is 3.3 V or smaller, for example.

In the semiconductor device 100, the buried polysilicon electrode 82 connected to the buried polysilicon 80 of the charge-attracting part 60 and the buried well electrode 86 connected to the buried well 84 are connected to the negative electrode of the power source 200.

Next, the operation of the charge-attracting part 60 when the semiconductor device 100 biased in the manner described above is activated will be explained with reference to FIG. 3.

When a prescribed bias voltage is applied, a depletion layer is generated in the first semiconductor layer 10 based on the difference in potential between the anode 12 and the cathode 13 of the photodiode 11. If X-ray is incident on the semiconductor device 100 in this state, electron-hole pairs are generated in the first semiconductor layer 10 of the photodiode 11, and the generated electrons are attracted to the cathode 13, and the generated holes are attracted to the anode 12. The electrons and holes are then taken out and observed.

Figure 3:
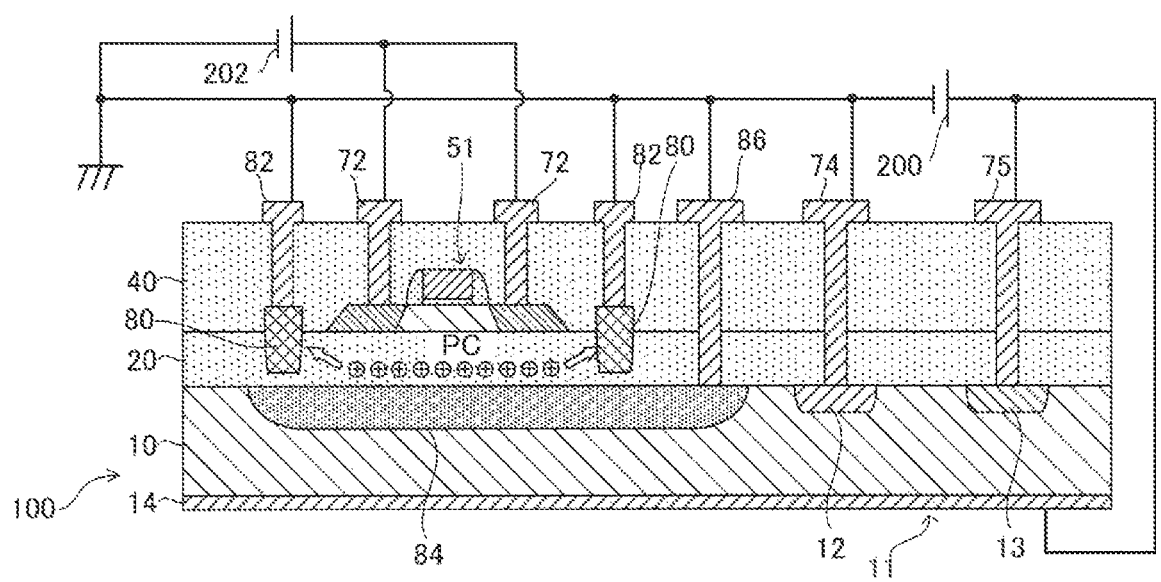
FIG. 3 is a vertical cross-sectional view for explaining how electrical charges are attracted in the semiconductor device of Embodiment 1.

When X-ray is incident on the semiconductor device 100 and electron-hole pairs are generated in insulating layers (first insulating layer 20 and second insulating layer 40) due to the phenomenon described above, positive charges PC might be trapped in the insulating layer as shown in FIG. 3. As the amount of incident X-ray increases, the amount of trapped positive charges also increases, and the accumulated charges in the insulating layer could adversely affect the operation of the transistor 51.

In order to solve this problem, in the semiconductor device 100 of this embodiment, a potential (ground potential in this embodiment) lower than the potential applied to the source and drain regions 52 of the transistor 51 (about +3.3V, for example) is applied to the buried polysilicon 80. Thus, the positive charges PC generated in the insulating layer due to the radiation of X-ray are attracted to the buried polysilicon 80, which reduces the amount of the positive charges PC below the transistor 51, in particular. By reducing the amount of positive charges PC near the transistor 51, the degree of characteristic change of the transistor 51 can be suppressed.

The semiconductor device 100 of this embodiment is configured to have the p-type buried well 84 applied with a potential lower than the potential applied to the source and drain regions 52 of the transistor 51, and a depletion layer is formed in the PN junction at the interface between the buried well 84 and the first semiconductor layer 10. Thus, the potential of the buried well 84 is not affected by the bias voltage applied to the first semiconductor layer 10 via the rear electrode 14, and is maintained at the same potential as that of the negative electrode side of the power source 200, which is applied to the buried well 84 (ground potential in this embodiment). This makes it possible for the buried polysilicon 80 to attract the positive charges PC efficiently. In this embodiment, the semiconductor device 100 does not necessarily have to have the buried well 84, and it is possible to attract the positive charges PC by the buried polysilicon 80 alone depending on the radiation amount of X-ray and the like.

As described above, the buried well 84 is formed so as to include the buried polysilicon 80 (so as to extend to the outer periphery of the buried polysilicon 80) in a plan view. When the buried well 84 is not formed between the buried polysilicon 80 and the first semiconductor layer 10, it is necessary to ensure a withstand voltage that at least corresponds to the voltage of the power source 200 between the buried polysilicon 80 and the first semiconductor layer 10, and in order to ensure this withstand voltage, an oxide film having a sufficient thickness needs to be provided, for example. In other words, it is possible to omit the buried well 84 as long as an oxide film that can ensure such a withstand voltage can be formed.

Next, one example of the manufacturing method of the semiconductor device 100 will be explained with reference to FIGS. 4 to 6. FIGS. 4 to 6 are vertical cross-sectional views showing the manufacturing method of the semiconductor device 100.

Figure 4A:
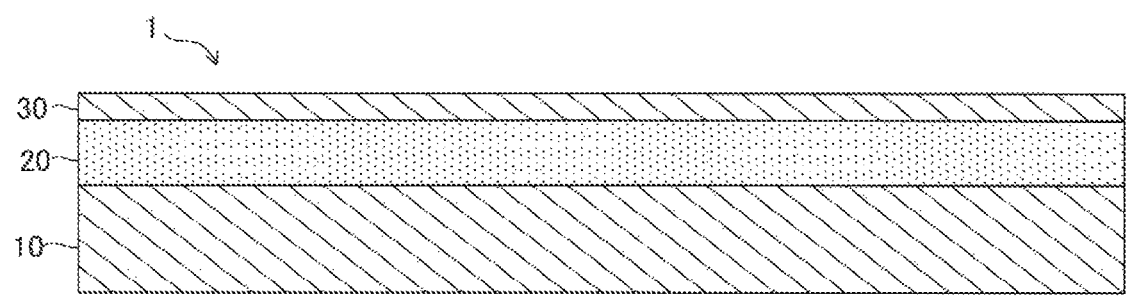
FIGS. 4A to 4D are vertical cross-sectional views showing an example of a manufacturing method of the semiconductor device of Embodiment 1.

First, an SOI substrate 1 in which a first semiconductor layer 10 made of an n-type semiconductor, a first insulating layer 20, and a second semiconductor layer 20 made of a p-type semiconductor are stacked in this order is prepared (FIG. 4A).

Figure 4B:
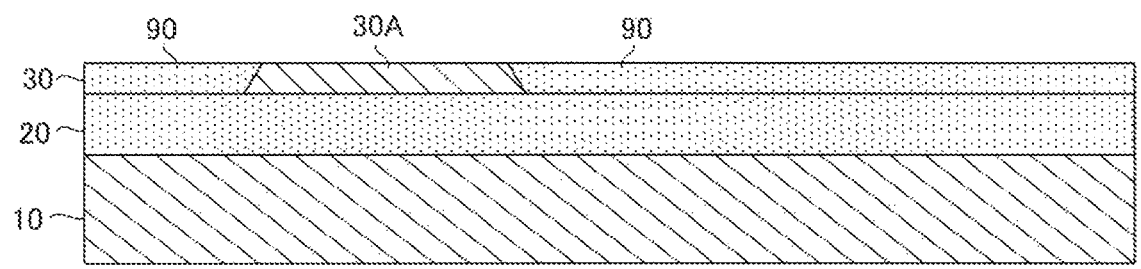

Next, a field oxide film 90 is formed in the second semiconductor layer 30 by the LOCOS (local oxidation of silicon) method. The portion of the second semiconductor layer 30 where the field oxide film 90 is not formed is an active region 30A in which a circuit element such as a transistor is to be formed (FIG. 4B).

Figure 4C:
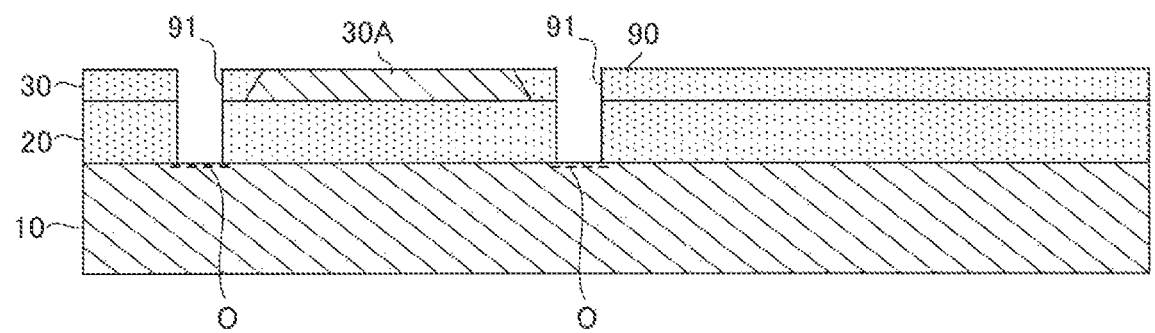

Next, the first insulating layer 20 and the field oxide film 90 are etched by photolithography, for example, so as to expose the first semiconductor layer 10 and form openings 91 that reach the first semiconductor layer 10 in regions where a buried polysilicon 80 is to be formed (FIG. 4C). The width of the openings 91 is approximately 0.5 μm, for example, and the openings 91 are formed at positions that are approximately 0.3 μm from the active region 30A, for example.

Next, the oxidation process is conducted on exposed areas O of the first semiconductor layer 10, thereby forming an $SiO_2$ film having a thickness of approximately 10 nm on the surface of the first semiconductor layer 10. This oxide film is an insulating film to provide insulation between the first semiconductor layer 10 and the buried polysilicon 80, which will be formed later, and is formed to allow different potentials (several V, for example) to be applied to the buried polysilicon 80 and to the first semiconductor layer 10, respectively. It is apparent that the formation method of the insulating film is not limited to this. It is also possible to partially remove the first insulating layer 20 in the etching process described above so that a portion thereof remains with a thickness of approximately 10 nm.

Figure 4D:
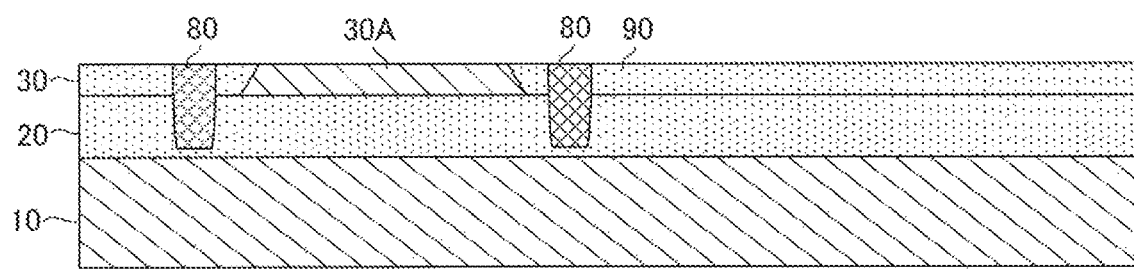

Next, the openings 91 are filled by the CVD (chemical vapor deposition) method using polysilicon, and thereafter, by etching back the deposited polysilicon, the thickness of the polysilicon is adjusted so that the top surface of the polysilicon is above the openings 91 (FIG. 4D). In this embodiment, doped polysilicon, which has an impurity doped therein in advance, is used for the polysilicon for forming the buried polysilicon 80. The doped polysilicon is polysilicon that contains an n-type impurity at a high concentration (approximately $1\times10^{20}$ cm$^{-3}$, for example), which is formed by supplying a gas including an n-type impurity (P (phosphorus), for example)) during the CVD process using polysilicon.

Figure 5A:
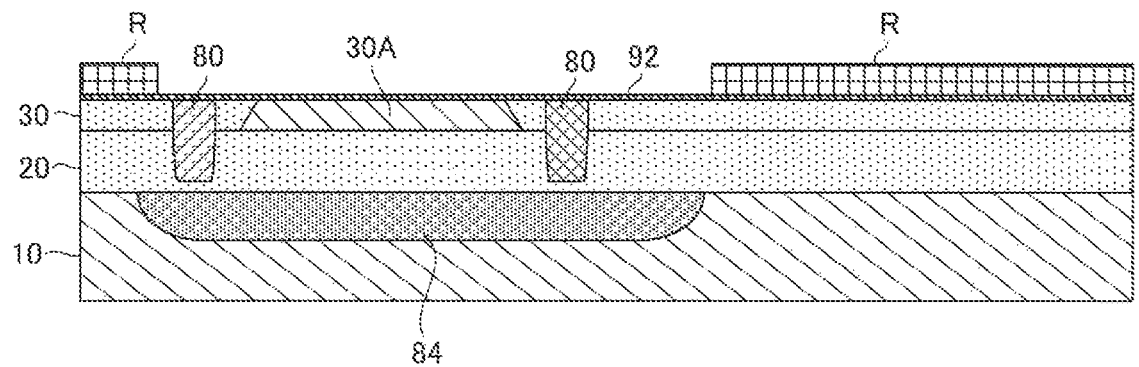
FIGS. 5A to 5D are vertical cross-sectional views showing an example of a manufacturing method of the semiconductor device of Embodiment 1.

Next, a gate oxide film 92 is formed in a region including the surface of the active region 30A. Then, a region other than a buried well 84 forming region in the first semiconductor layer 10 is entirely covered by a photoresist R and a p-type impurity such as B (boron) is injected, thereby forming the buried well 84 (FIG. 5A). In this process, the impurity concentration of the buried well 84 is set to approximately $1\times10^{17}$ cm$^{-3}$, for example.

Figure 5B:
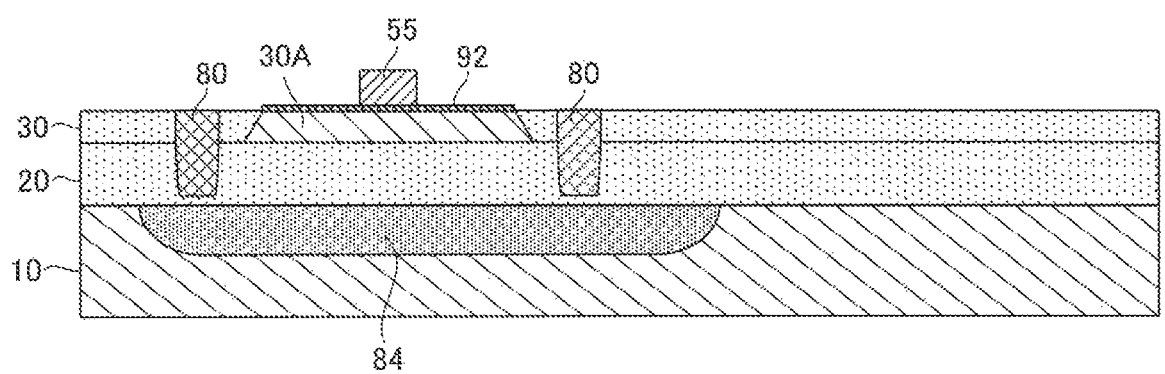

Next, a polysilicon film is deposited on the gate oxide film 92, and by patterning the polysilicon film by photolithography, a gate electrode 55 is formed (FIG. 5B).

Figure 5C:
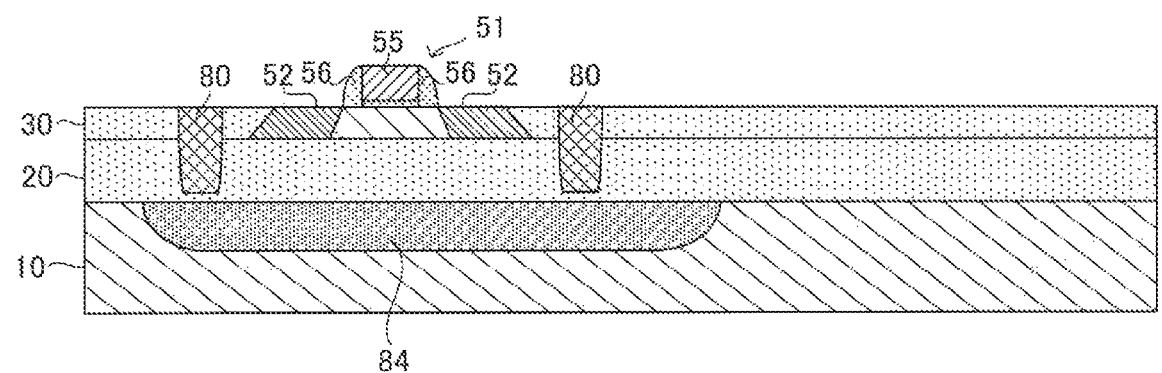

Next, a side wall 56 is formed on each side of the gate electrode 55. Thereafter, an impurity containing a group V element such as phosphorus or arsenic is injected into the active region 30A in the second semiconductor layer 30 by the ion injection method, thereby forming source and drain regions 52 made of a high concentration n-type semiconductor at the respective sides of the gate electrode 55. This way, the transistor 51 is formed (FIG. 5C).

Figure 5D:
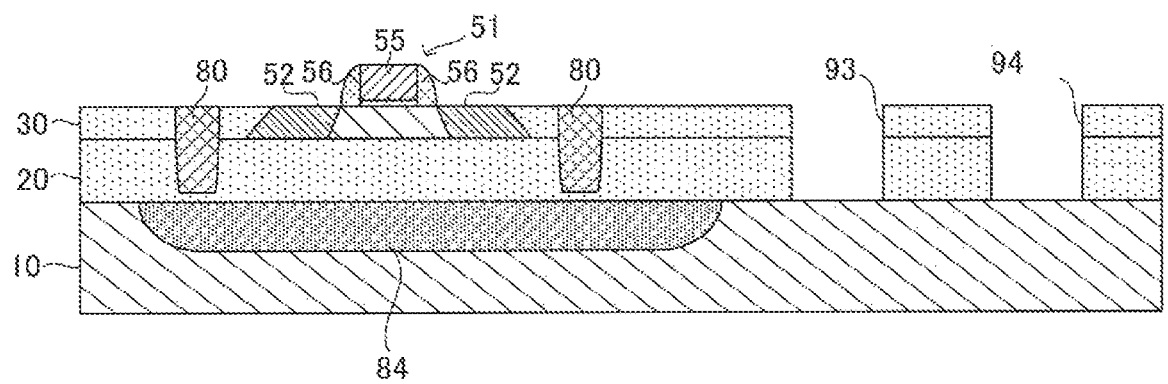

Next, by dry-etching, openings 93 and 94 that respectively reach the first semiconductor layer 10 through the field oxide film 90 and the first insulating layer 20 are formed (FIG. 5D). If a contact region is to be formed in the buried well 84, an opening that reaches the buried well 84 is also formed in this process.

Figure 6A:
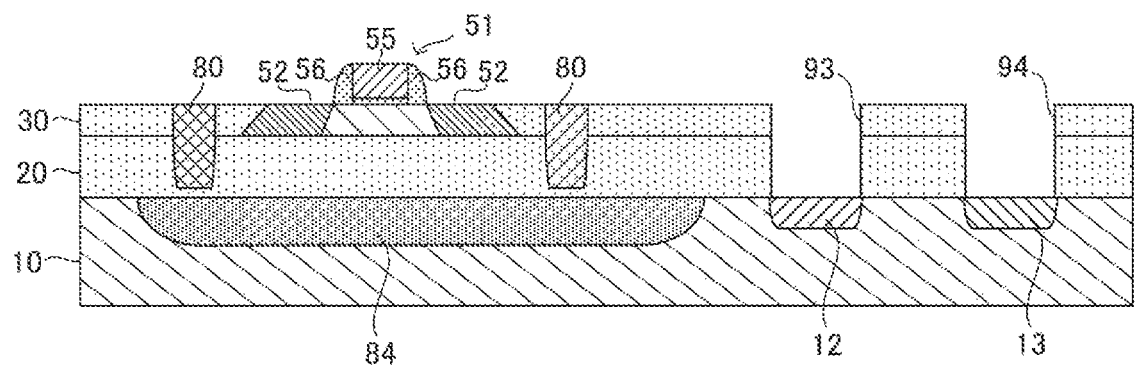
FIGS. 6A to 6D are vertical cross-sectional views showing an example of a manufacturing method of the semiconductor device of Embodiment 1.

Next, by injecting an impurity containing a group V element such as phosphorus or arsenic to a portion of the first semiconductor layer 10 that is exposed in the opening 94 by the ion injection method, a cathode 13 made of a high concentration n-type semiconductor is formed on the surface of the first semiconductor layer 10. Next, by injecting an impurity containing a group III element such as boron to a portion of the first semiconductor layer 10 that is exposed in the opening 93 by the ion injection method, an anode 12 made of a high concentration p-type semiconductor is formed on the surface of the first semiconductor layer 10 (FIG. 6A). If a contact region is to be formed in the buried well 84, an impurity containing a group III element such as boron is injected into a portion exposed in an opening formed in the preceding process.

Figure 6B:
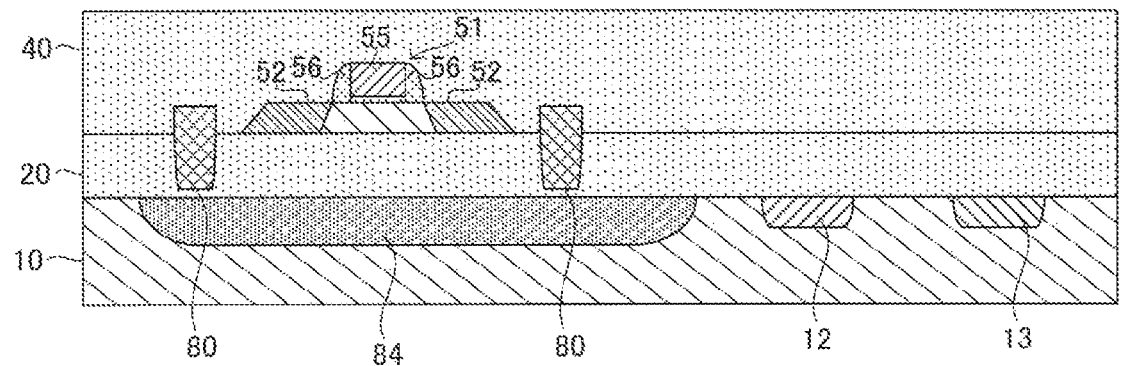

Next, by the CVD method, a second insulating layer 40 is formed of an insulator such as an $SiO_2$ film so as to cover the second semiconductor layer 30 where the circuit element including the transistor 51 is formed. The openings 93 and 94 formed in the preceding process are filled by the second insulating layer 40 (FIG. 6B).

Figure 6C:
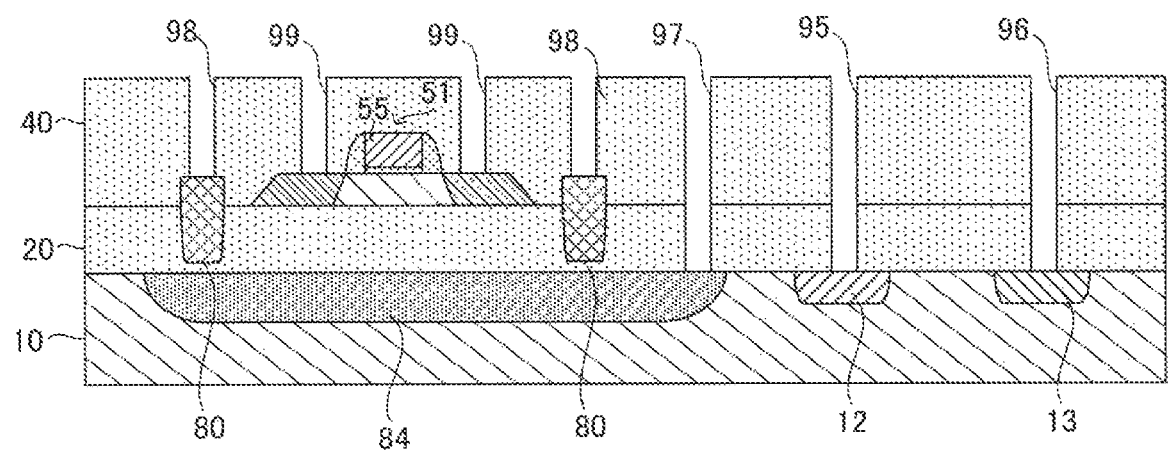

Next, openings 99 that reach the source and drain regions 52 through the second insulating layer 40 and openings 98 that reach the buried polysilicon 80 through the second insulating layer 40 are formed by dry-etching. Also, an opening 97 that reaches the buried well 84 formed in the first semiconductor layer 10 through the second insulating layer 40, the field oxide film 90, and the first insulating layer 20 is formed by dry-etching. Furthermore, openings 95 and 96 that reach the anode 12 and cathode 13 formed in the first semiconductor 10, respectively, are formed through the second insulating layer 40, the field oxide film 90, and the first insulating layer 20 by dry-etching (FIG. 6C).

Figure 6D:
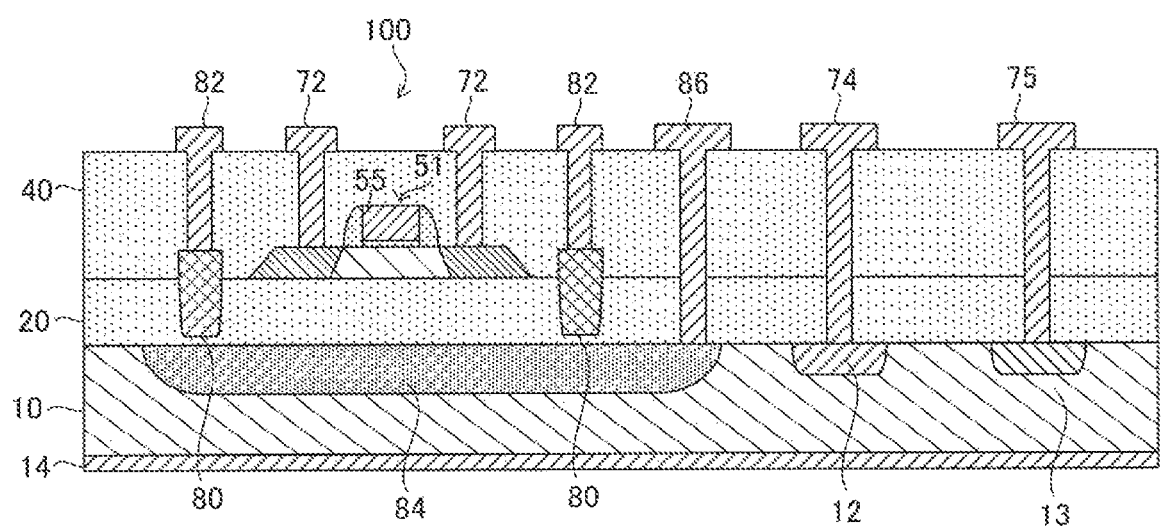

Next, a metal such as aluminum is deposited on the surface of the second insulating layer 40 by spattering. The openings 95, 96, 97, 98, and 99 are filled by this metal. Thereafter, this metal is patterned into a desired shape. This way, source and drain electrodes 72 connected to the source and drain regions 52, buried polysilicon electrodes 82 connected to the buried polysilicon 80, a buried well electrode 86 connected to the buried well 84, an anode electrode 74 connected to the anode 12, and a cathode electrode 75 connected to the cathode 13 are formed. Next, a rear electrode 14 is formed on the rear surface of the first semiconductor layer 10 by spattering (FIG. 6D).

The semiconductor device 100 of this embodiment is manufactured by the manufacturing method described above.

Embodiment 2

Figure 7:
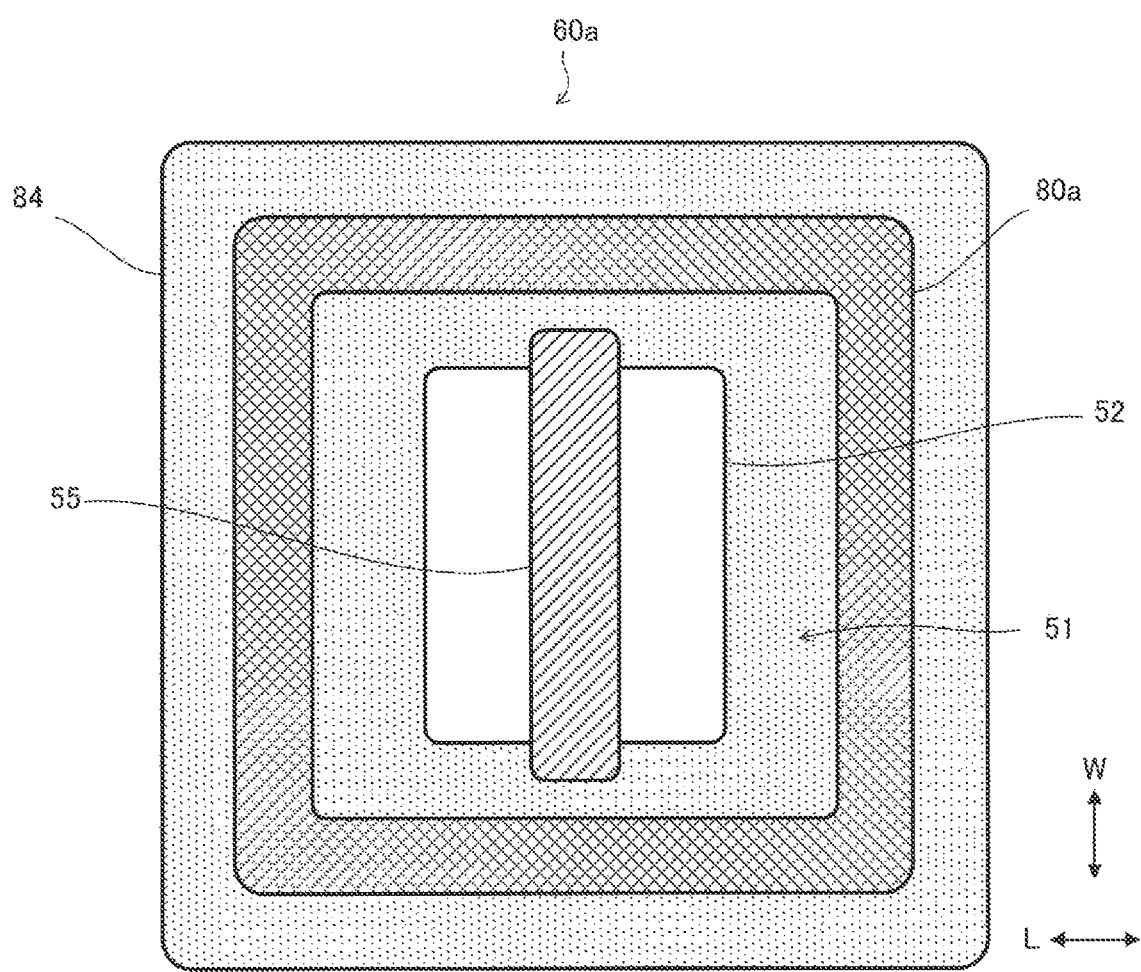
FIG. 7 is a plan view showing an example of the configuration of a charge-attracting part of Embodiment 2.

A semiconductor device 100a of this embodiment will be explained with reference to FIG. 7. FIG. 7 is a plan view showing a charge-attracting part 60a of the semiconductor device 100a. The semiconductor device 100a differs from the semiconductor device 100 in the shape of the buried polysilicon 80. Thus, the same configurations as those of the semiconductor device 100 are given the same reference characters, and the detailed descriptions thereof will be omitted.

As shown in FIG. 7, the position in the gate width direction relative to the transistor 51 and the width of the buried polysilicon 80a of the charge-attracting part 60a of this embodiment are similar to those of the buried polysilicon 80, but the buried polysilicon 80a differs from the buried polysilicon 80 in that the buried polysilicon 80a is formed to surround the transistor 51.

In the semiconductor device 100 in which the buried polysilicon 80 has two regions separated from each other in the gate width direction of the transistor 51, if the gate width of the gate electrode 55 is great, a distance between the center of the transistor 51 and the buried polysilicon 80 would be longer, which possibly makes it difficult to efficiently attract the positive charges PC generated near the center of the transistor 51. In order to solve this problem, in this embodiment, the buried polysilicon 80a is formed so as to surround the transistor 51. With this configuration, the positive charges PC generated near the center of the transistor 51 can be attracted in the gate length direction (direction indicated with the arrow L in FIG. 7), and therefore, it is possible to make the positive charges PC attracted to the buried polysilicon more efficiently.

Embodiment 3

Figure 8:
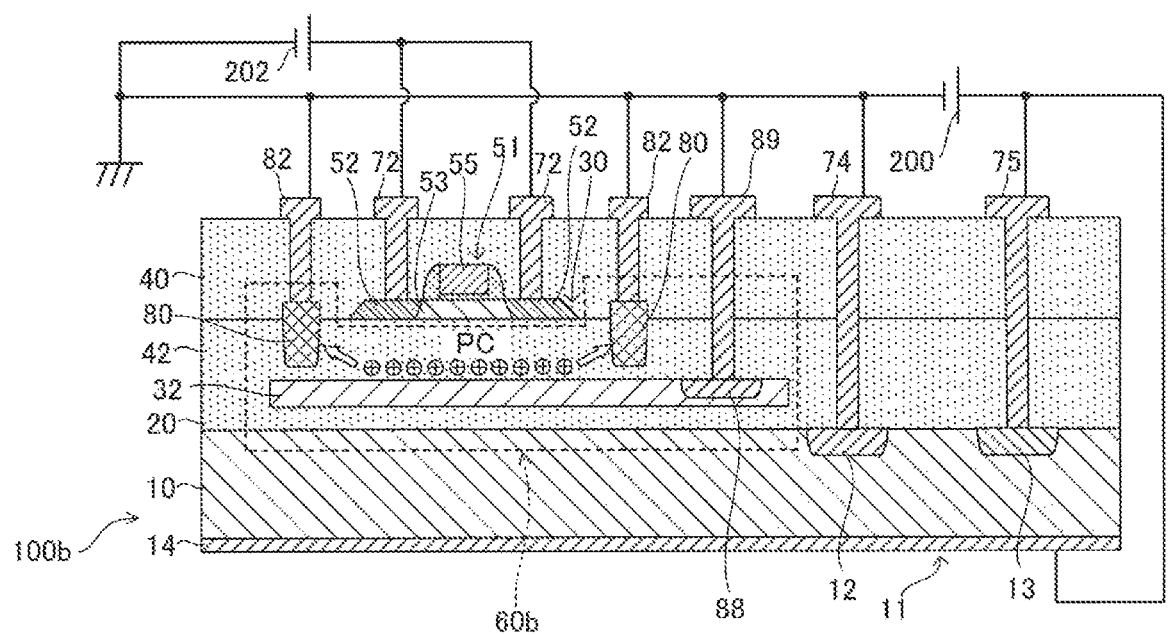
FIG. 8 is a vertical cross-sectional view showing an example of the configuration of a semiconductor device of Embodiment 3.

A semiconductor device 100b of this embodiment will be explained with reference to FIG. 8. FIG. 8 is a vertical cross-sectional view showing an example of the configuration of the semiconductor device 100b. The semiconductor device 100b differs from the semiconductor device 100 in that a double-SOI (double-silicon on insulator) substrate is used for the substrate and that a fixed potential region is formed using an intermediate semiconductor layer instead of the fixed potential region by the buried well 84 of the semiconductor device 100. Thus, the same configurations as those of the semiconductor device 100 are given the same reference characters, and the detailed descriptions thereof will be omitted.

In the double-SOI substrate, a first semiconductor layer 10 made of an n-type semiconductor, a first insulating layer 20, an intermediate semiconductor layer 32, a third insulating layer 42, and a second semiconductor layer 30 made of a p-type semiconductor are stacked in this order.

The intermediate semiconductor layer 32 made of an n-type semiconductor is formed between the first semiconductor layer 10 having the photodiode 11 formed therein and the second semiconductor layer 30 having the circuit element such as the transistor 51 formed therein. Between the intermediate semiconductor layer 32 and the first semiconductor layer 10, the first insulating layer 20 made of an insulator such as an SiO$_2$ film is formed, and between the intermediate semiconductor layer 32 and the second semiconductor layer 30, the third insulating layer 42 made of an insulator such as an SiO$_2$ film is formed.

The intermediate semiconductor layer 32 includes a contact region 88 made of an n-type semiconductor that has a higher concentration than that of the intermediate semiconductor layer 32. The contact region 88 is connected to an intermediate semiconductor layer electrode 89, and the intermediate semiconductor layer electrode 89 is connected to the negative electrode of the power source 200. In the semiconductor device 100b, the charge-attracting part 60b is constituted of the buried polysilicon 80 and the intermediate semiconductor layer 32. The buried polysilicon 80 of this embodiment may have two regions that are separated from the transistor 51 in the gate width direction of the transistor 51 and that extend in the gate length direction as shown in FIG. 2, or may be formed so as to surround the transistor 51 as shown in FIG. 7.

As shown in FIG. 8, in the semiconductor device 100b, the potential applied to the intermediate semiconductor layer 32 disposed below the transistor 51 is adjusted so as to cancel the positive charges PC accumulated in the insulating layer (mainly the third insulating layer 42). This makes it possible to further suppress the characteristic change of the transistor 51.

The semiconductor device 100b of this embodiment can be manufactured according to the manufacturing method of the semiconductor device 100 shown in FIGS. 4 to 6. The manufacturing method thereof will be briefly explained below.

First, a double-SOI substrate is prepared by stacking a first semiconductor layer 10 made of an n-type semiconductor, a first insulating layer 20, an intermediate semiconductor layer 32, a third insulating layer 42, and a second semiconductor layer 30 made of a p-type semiconductor in this order (see FIG. 4A for reference).

Next, a field oxide film is formed in the second semiconductor layer 30 by the LOCOS method. The portion of the second semiconductor layer 30 where the field oxide film is not formed is an active region in which a circuit element such as a transistor is to be formed (see FIG. 4B for reference).

Next, the field oxide film, which was formed in the preceding process, and the first insulating layer 20 are etched by photolithography, for example, so as to expose the intermediate semiconductor layer 32 and form openings that reach the intermediate semiconductor layer 32 in regions where a buried polysilicon 80 is to be formed (see FIG. 4C for reference).

Next, the oxidation process is conducted on the exposed areas of the intermediate semiconductor layer 32, the openings are filled by the CVD method using doped polysilicon, and the thickness of the polysilicon is adjusted by etching back the deposited polysilicon (see FIG. 4D for reference).

Next, after forming a gate oxide film in a region that includes the surface of the active region, a polysilicon film is deposited on the gate oxide film, and by patterning the polysilicon film by photolithography, a gate electrode 55 is formed (see FIG. 5B for reference).

Next, a side wall is formed on each side of the gate electrode 55. Next, by injecting an impurity containing a group V element such as phosphorus or arsenic to the active region of the second semiconductor layer 30 by the ion injection method, source and drain regions 52 made of a high-concentration n-type semiconductor are formed at the respective sides of the gate electrode. This way, the transistor 51 is formed (see FIG. 5C for reference).

Next, an opening for forming a contact region 88 is formed so as to reach the intermediate semiconductor layer 32 through the field oxide film and the third insulating layer 42 by dry-etching. Also, openings for forming an anode 12 and a cathode 13 are formed so as to reach the first semiconductor layer 10 through the field oxide film, the third insulating layer 42, the intermediate semiconductor layer 32, and the first insulating layer 20 by dry-etching (see FIG. 5D for reference).

Next, by injecting an impurity containing a group V element such as phosphorus or arsenic to a portion of the intermediate semiconductor layer 32 that is exposed in the opening by the ion injection method, the contact region 88 made of a high concentration n-type semiconductor is formed on the surface of the intermediate semiconductor layer 32.

Next, by injecting an impurity containing a group V element such as phosphorus or arsenic to a portion of the first semiconductor layer 10 that is exposed in the opening by the ion injection method, a cathode 13 made of a high concentration n-type semiconductor is formed on the surface of the first semiconductor layer 10. Thereafter, by injecting an impurity containing a group III element such as boron to a portion of the first semiconductor layer 10 that is exposed in the opening by the ion injection method, an anode 12 made of a high concentration p-type semiconductor is formed on the surface of the first semiconductor layer 10 (see FIG. 6A for reference).

Next, by the CVD method, a second insulating layer 40 is formed of an insulator such as an $SiO_2$ film so as to cover the second semiconductor layer 30 where the circuit element including the transistor 51 is formed. The openings formed in the preceding process are filled by the second insulating layer 40 (see FIG. 6B for reference).

Next, openings that reach the source and drain regions 52 through the second insulating layer 40 and openings that reach the buried polysilicon 80 through the second insulating layer 40 are formed by dry-etching. Also, an opening that reaches the contact region 88 formed in the intermediate semiconductor layer 32 is formed through the second insulating layer 40, the field oxide film, and the third insulating layer 42 by dry-etching. Furthermore, openings that reach the anode 12 and the cathode 13 formed in the first semiconductor 10, respectively, are formed through the second insulating layer 40, the field oxide film, the third insulating layer 42, and the first insulating layer 20 by dry-etching (see FIG. 6C for reference).

Next, a metal such as aluminum is deposited on the surface of the second insulating layer 40 by spattering. The openings formed in the preceding process are filled by this metal. Thereafter, this metal is patterned into a desired shape. This way, source and drain electrodes 72 connected to the source and drain regions 52, buried polysilicon electrodes 82 connected to the buried polysilicon 80, an intermediate semiconductor layer electrode 89 connected to the contact region 88, an anode electrode 74 connected to the anode 12, and a cathode electrode 75 connected to the cathode 13 are formed. Next, a rear electrode 14 is formed on the rear surface of the first semiconductor layer 10 by spattering (see FIG. 6D for reference).

The semiconductor device 100b of this embodiment is manufactured by the manufacturing method described above.

In the embodiments described above, the buried polysilicon and the fixed potential region (buried well 84 and intermediate semiconductor layer 32) are connected to the negative electrode of the power source 200, or in other words, to the ground, but the present invention is not limited to this configuration. A different power source from the power source 200 may be connected to the buried polysilicon and the fixed potential region so that a potential is applied independently of the power source 200, or a negative potential may be applied. The buried polysilicon and the fixed potential region do not necessarily have to have the same potential, and different levels of potential may be applied to the buried polysilicon and the fixed potential region, respectively.

What is claimed is:

1. A semiconductor device, comprising:
    a first semiconductor layer of a first conductivity type having a first surface on one side thereof and a second surface on an opposite side thereof, and having an element therein;
    a second semiconductor layer of a second conductivity type having a circuit element formed therein, the second semiconductor layer being formed at the one side of the first surface of the first semiconductor layer;
    an insulating layer disposed on the first surface of the first semiconductor layer; and
    a charge-attracting layer configured to attract electrical charges generated in the insulating layer when a predetermined voltage is supplied to the charge-attracting layer.

2. The semiconductor device according to claim 1, wherein the predetermined voltage is lower than a voltage supplied to the circuit element.

3. The semiconductor device according to claim 1, wherein the predetermined voltage has a ground level.

4. The semiconductor device according to claim 1, wherein the insulating layer has a withstand voltage between the second semiconductor layer and the charge-attracting layer greater than the predetermined voltage.

5. The semiconductor device according to claim 1, wherein
    the circuit element includes a field-effect transistor, and
    the charge-attracting layer is embedded in the insulating layer, having two regions isolated each other, the two regions being disposed in relation to one and another of ends of the field-effect transistor in a gate width direction, respectively, and extending in a gate length direction in a plan view, so as to attract the electrical charges.

6. The semiconductor device according to claim 1, wherein
    the circuit element includes a field-effect transistor, and
    the charge-attracting layer is embedded in the insulating layer, surrounding the field-effect transistor in a plan view, and is disposed in relation to the field-effect transistor so as to attract the electrical charges.

7. The semiconductor device according to claim 1, further comprising a predetermined potential region of the second conductivity type that is formed in the first semiconductor layer so as to cover an area in which the charge-attracting layer is formed in a plan view, the predetermined potential region including a contact region in which the predetermined voltage is supplied.

8. The semiconductor device according to claim 1, further comprising:
    an intermediate semiconductor layer formed in the insulating layer between the first semiconductor layer and the second semiconductor layer; and
    a predetermined potential region of the first conductivity type that is formed in the intermediate semiconductor layer so as to cover an area in which the charge-attracting layer is formed in a plan view, the predetermined potential region including a contact region in which the predetermined voltage is supplied.

\* \* \* \* \*